United States Patent
Lin (10) Patent No.: US 7,683,620 B2
(45) Date of Patent: Mar. 23, 2010

(54) SUPPRESSION OF NOISE IN MR IMAGES AND MR SPECTROSCOPIC IMAGES USING SIGNAL SPACE PROJECTION FILTERING

(75) Inventor: Fa-Hsuan Lin, Brookline, MA (US)

(73) Assignee: The General Hospital Corporation, Boston, MA (US)

( * ) Notice: Subject to any disclaimer, the term of this patent is extended or adjusted under 35 U.S.C. 154(b) by 19 days.

(21) Appl. No.: 12/114,339

(22) Filed: May 2, 2008

(65) Prior Publication Data

US 2008/0272782 A1  Nov. 6, 2008

Related U.S. Application Data

(60) Provisional application No. 60/927,461, filed on May 3, 2007.

(51) Int. Cl.
   *G01V 3/00* (2006.01)
(52) U.S. Cl. .................................................. 324/309
(58) Field of Classification Search ......... 324/300–322; 600/410–435
   See application file for complete search history.

(56) References Cited

U.S. PATENT DOCUMENTS

| | | | | |
|---|---|---|---|---|
| 5,309,100 A | * | 5/1994 | Song et al. ............ | 324/306 |
| 7,127,095 B2 | * | 10/2006 | El Fakhri et al. ............ | 382/128 |
| 7,394,251 B2 | | 7/2008 | Lin | |
| 7,519,211 B2 | * | 4/2009 | El Fakhri et al. ............ | 382/128 |
| 2008/0135789 A1 | * | 6/2008 | Du et al. ............ | 250/580 |
| 2009/0052612 A1 | * | 2/2009 | Wu et al. ............ | 378/5 |

OTHER PUBLICATIONS

Fa-Hsuan Lin et al. "Dynamic Magnetic Resonance Inverse Imaging of Human Brain Function" Submitted to Magnetic Resonance in Medicine, Nov. 7, 2005.

* cited by examiner

*Primary Examiner*—Brij B Shrivastav
*Assistant Examiner*—Dixomara Vargas
(74) *Attorney, Agent, or Firm*—Qualres & Brady LLP (57) ABSTRACT

A method for suppressing the noise component of a measured magnetic resonance (MR) signal is disclosed. In particular, a signal-space projection operator is produced and employed to suppress the noise component from acquired MR signals that is uncorrelated with the spatial pattern of a desired NMR signal. In one embodiment, an fMRI scan is performed to acquire time course image data. The NMR data is filtered with a signal-space projection operator and reconstructed into a series of image frames. In another embodiment, the signal-space projection operator is employed to suppress lipid signal in MRS image data.

20 Claims, 8 Drawing Sheets

SUPPRESSION OF NOISE IN MR IMAGES AND MR SPECTROSCOPIC IMAGES USING SIGNAL SPACE PROJECTION FILTERING

CROSS-REFERENCE TO RELATED APPLICATIONS

This application claims the benefit of U.S. Provisional Patent Application Ser. No. 60/927,461 filed on May 3, 2007, and entitled "Suppression of Noise in MR Images and MR Spectroscopic Images Using Signal Space Projection Filtering".

STATEMENT REGARDING FEDERALLY SPONSORED RESEARCH

This invention was made with United States government support awarded by the following agency: NIH R01 HD040712, NIH R01 NS037462, and NIH P41 RR14075. The United States has certain rights in this invention.

BACKGROUND OF THE INVENTION

The field of the invention is nuclear magnetic resonance imaging (MRI) methods and systems. More particularly, the invention relates to the filtering of MRI and MRS data to suppress noise patterns that are uncorrelated with the signal pattern.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient (Gy) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

To reduce the time needed to acquire data for an MR image multiple NMR signals may be acquired in the same pulse sequence. The echo-planar pulse sequence was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and this method is commonly used where the clinical application requires a high temporal resolution. Echo-planar pulse sequences are disclosed in U.S. Pat. Nos. 4,678,996; 4,733,188; 4,716,369; 4,355,282; 4,588,948 and 4,752,735.

A variant of the echo-planar imaging method is the Rapid Acquisition Relaxation Enhanced (RARE) sequence which is described by J. Hennig et al in an article in Magnetic Resonance in Medicine 3,823-833 (1986) entitled "RARE Imaging: A Fast Imaging Method for Clinical MR." The essential difference between the RARE (also called a fast spin-echo or FSE) sequence and the EPI sequence lies in the manner in which NMR echo signals are produced. The RARE sequence, utilizes RF refocused echoes generated from a Carr-Purcell-Meiboom-Gill sequence, while EPI methods employ gradient recalled echoes.

Figure 2:
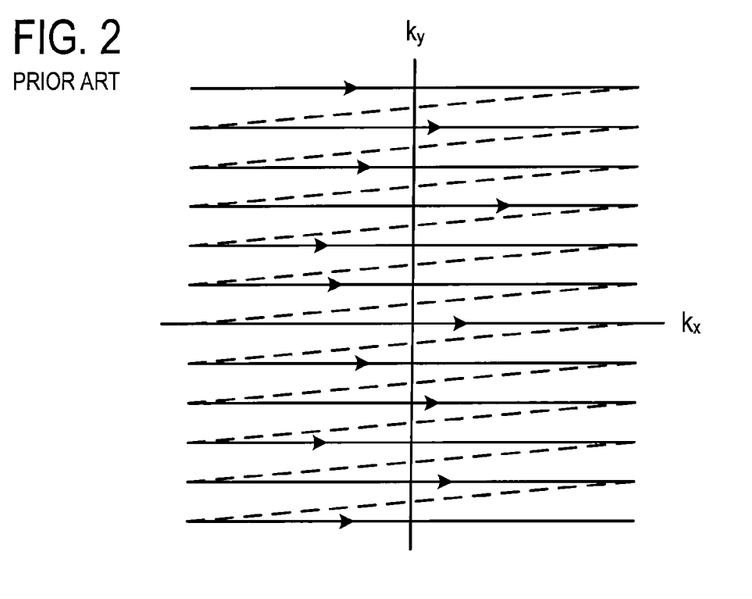
FIG. 2 is a graphic illustration of the Cartesian, or Fourier k-space sampling pattern.
Figure 3:
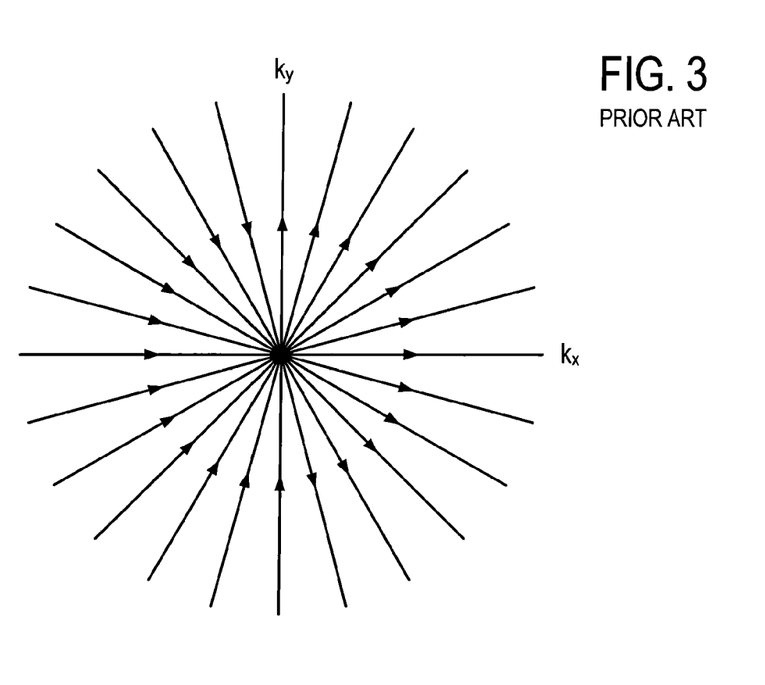
FIG. 3 is a graphic illustration of a radial, or projection reconstruction k-space sampling pattern.

Other MRI pulse sequences are known which sample 2D or 3D k-space without using phase encoding gradients. These include the projection reconstruction methods known since the inception of magnetic resonance imaging and again being used as disclosed in U.S. Pat. No. 6,487,435. Rather than sampling k-space in a rectilinear, or Cartesian, scan pattern by stepping through phase encoding values as described above and shown in FIG. 2, projection reconstruction methods sample k-space with a series of views that sample radial lines extending outward from the center of k-space as shown in FIG. 3. The number of projection views needed to sample k-space determines the length of the scan and if an insufficient number of views are acquired, streak artifacts are produced in the reconstructed image. There are a number of variations of this straight line, radial sampling trajectory in which a curved path is sampled. These include spiral projection imaging and propeller projection imaging.

Recently, parallel MRI scanning methods using spatial information derived from the spatial distribution of the receive coils and a corresponding number of receiver channels has been proposed to accelerate MRI scanning. This includes the k-space sampling methods described in Sodickson D K, Manning W J, "Simultaneous Acquisition Of Spatial Harmonics (SMASH)" Fast Imaging With Radiofrequency Coil Arrays", Magn. Reson. Med. 1997; 38(4):591-603, or Griswold M A, Jacob P M, Heidemann R M, Nittka M, Jellus V, Wang J, Kiefer B, Hasse A, "Generalized Autocalibrating Partially parallel Acquisitions (GRAPPA)", Magn. Reson. Med. 2002; 47(6):1202-1210, or Pruessmann K P, Weiger M, Scheidegger M B, Boesiger P, "SENSE: Sensitivity Encoding For Fast MRI", Magn. Reson. Med. 1999; 42(5):952-962, all of which share a similar theoretical background. Parallel MRI accelerates image data acquisition at the cost of reduced signal-to-noise ratio (SNR). The temporal acceleration rate is limited by the number of coils in the array and the number of separate receive channels, and the phase-encoding schemes used. Typically, acceleration factors of 2 or 3 are achieved.

Mathematically, the attainable acceleration in parallel MRI is limited by the available independent spatial information among the channels in the array. The parallel MRI image reconstruction manifests itself as a problem in solving an over-determined linear system using this spatial information. Therefore, advances in the coil array design with more coil elements and receiver channels can increase the acceleration rate when using the parallel MRI technique. Recently, optimized head coil arrays have been extended from 8-channel as described in de Zwart J A, Ledden P J, Kellman P, van Gelderen P, Duyn J H, "Design Of A SENSE-Optimized High-Sensitivity MRI Receive Coil For Brain Imaging", Magn. Reson. Med. 2002; 47(6):1218-1227, to 16-channel as described in de Zwart J A, Ledden P J, van Gelderen P, Bodurka J, Chu R, Duyn J H, "Signal-To-Noise Ratio And Parallel Imaging Performance Of A 16-Channel Receive-Only Brain Coil Array At 3.0 Tesla", Magn. Reson. Med. 2004; 51(1):22-26, as well as 23 and 90-channel arrays as described in Wiggins G C, Potthast A, Triantafyllou C, Lin F-H, Benner T, Wiggins C J, Wald L L, "A 96-Channel MRI System With 23- and 90-Channel Phase Array Head Coils At 1.5 Tesla", 2005; Miami, Fla., USA, International Society for Magnetic Resonance in Medicine, p 671.

As described recently by McDougall M P, Wright S M, "64-Channel Array Coil For Single Echo Acquisition Magnetic Resonance Imaging", Magn. Reson. Med. 2005; 54(2): 386-392, a dedicated 64-channel linear planar array was developed to achieve 64-fold acceleration using a single echo acquisition (SEA) pulse sequence and a SENSE reconstruction method. The SEA approach depends on the linear array layout and localized RF coil sensitivity in individual receiver channels to eliminate the phase encoding steps required in conventional imaging. The challenge of this approach is the limited sensitivity in the perpendicular direction to the array plane and the extension of the methodology to head-shaped geometries.

Functional magnetic resonance imaging (fMRI) technology provides an approach to study neuronal activity. Conventional fMRI detects changes in cerebral blood volume, flow, and oxygenation that locally occur in association with increased neuronal activity induced by functional paradigms. As described in U.S. Pat. No. 5,603,322, an MRI system is used to acquire signals from the brain over a period of time. As the brain performs a task, these signals are modulated synchronously with task performance to reveal which regions of the brain are involved in performing the task. The series of fMRI time course images must be acquired at a rate that is high enough to see the changes in brain activity induced by the functional paradigm. In addition, because neuronal activity may occur at widely dispersed locations in the brain, a relatively large 3D volume or multi-slice volume must be acquired in each time frame.

Magnetic Resonance Spectroscopy (MRS) may be used in vivo for the determination of individual chemical compounds located within a volume of interest. The underlying principle of MRS is that atomic nuclei are surrounded by a cloud of electrons that slightly shield the nucleus from any external magnetic field. As the structure of the electron cloud is specific to an individual molecule or compound, the magnitude of this screening effect is then also a characteristic of the chemical environment of individual nuclei. Since the resonant frequency of the nuclei is proportional to the magnetic field it experiences, the resonant frequency can be determined not only by the external applied field, but also by the small field shift generated by the electron cloud. Detection of this chemical shift, which is usually expressed as "parts per million" (PPM) of the main frequency, requires high levels of homogeneity of the main magnetic field $B_0$.

Typically, MR proton spectroscopy is used to generate a one-dimensional (1D) frequency spectrum representing the presence of certain chemical bonds in the region of interest. In medical diagnosis and treatment, MRS provides a non-invasive means of identifying and quantifying metabolites from a region of interest, often the human brain. By finding the relative spectral amplitudes resulting from frequency components of different molecules, medical professionals can identify chemical species and metabolites indicative of diseases, disorders, and other pathologies such as Alzheimer's disease, cancer, stroke, and the like. In this context, two nuclei are typically of particular interest, $^1H$ and $^{31}P$. Phosphorus 31 MRS is directed to the detection of compounds involved in energy metabolism relating to membrane synthesis and degradation. Metabolites of particular interest in proton MRS studies include glutamate (Glu), glutainine (Gln), choline (Cho), creatine (Cre), N-acetylasparate (NAA), and the inositols (ml and sl). With new contrast agents such as hyperpolarized C13, metabolic processes can be observed in the human body, e.g. in the context of cancer detection, by analyzing the signal contributions from various metabolites in regions of interest. Also, much work has been done in cardiac energetics using $^{31}P$ spectroscopy.

Over the past two decades, many fast spectroscopic imaging techniques have been proposed; among them, multiple spin-echo acquisition, echo-planar spatial encoding, and spiral readout. Compared to the traditional chemical-shift imaging (CSI) technique, these methods offer 2- to 4-fold accelerations in data acquisition time. By contrast, Proton-Echo-Planar-Spectroscopic-Imaging (PEPSI) can accelerate data acquisition by an order of magnitude using echo-planar readouts to collect spectral and 1-dimensional spatial information. The PEPSI technique has been developed for clinical MR scanners to measure 2D and 3D metabolite distributions in several minutes and with high spatial resolution. Given its benefit of fast acquisition, the PEPSI technique has already been employed in many clinical MRS studies.

In co-pending U.S. patent application Ser. No. 11/484,091 filed on Jul. 11, 2006 and entitled "Dynamic Magnetic Resonance Inverse Imaging", a method is described which is capable of extremely fast data acquisition due to the minimal gradient cycling used for spatial encoding. This method can resolve physiologic fluctuations caused, for example, by the cardiac and respiratory cycles. In fMRI experiments, functional activations are used to produce corresponding signal fluctuations in active regions of the brain. These, desired signal fluctuations can often be obscured by the aforementioned physiologic fluctuations and are generally considered to be noise. A method for filtering out such noise fluctuations from the measured NMR signals is needed.

Another situation in which noise fluctuations can obscure the desired NMR signal is the field of MR spectroscopy. Lipid contamination originating from Gibbs ringing artifacts may complicate the metabolite quantification in MR spectroscopic imaging. Suppression of lipid signal can be done either by outer volume saturation bands at the perimeter of the brain or by lipid nulling with inversion recovery pulses at the cost of increased SAR, which is particularly challenging at high fields. Alternatively, lipid suppression can be implemented by post-processing methods, such as widening the k-space sampling of lipid signal and therefore diminishing the Gibbs ringing, and extrapolating lipid signal to a larger k-space region in order to reduce Fourier construction artifacts. Another category of lipid suppression aims to localize lipid signal directly from arbitrarily shaped volume of interest.

SUMMARY OF THE INVENTION

The present invention overcomes the drawbacks of the prior methods by providing a method to suppress noise in acquired NMR measurements that obscures a desired NMR signal. This noise can, in general, be characterized as a component of the measured signal that obscures a desired signal pattern. More specifically, the present invention suppresses spatial patterns corresponding to noise from the spatial and temporal (or spectral) patterns of acquired MRI data.

The invention employs a signal-space projection operator to suppresses a noise signal component that is uncorrelated with the spatial patterns of the desired NMR signals. The signal-space projection operator may be used in fMRI studies to suppress noise produced by physiologic functions not correlated with the activation pattern being used, and it may also be used to suppress lipid signals not correlated with the spatial patterns of metabolites in MRS studies.

It is an object of the invention to employ a signal-space projection operator to suppress noise particularly of physiological origin in MR inverse imaging (InI) data acquired during an fMRI study. When the present invention is employed in an fMRI study, the signal-space projection operator suppresses the spatial pattern of noise measured in channels of a parallel RF coil array that is uncorrelated with the spatial pattern of the NMR signal to be detected. In studies of evoked functional responses such as event-related fMRI, the characterization of the noise spatial pattern is implemented by concatenating the pre-stimulus baselines of the acquired fMRI data.

It is another object of the invention to employ a signal-space projection operator to suppress signal from a selected spin species in MR image data. More specifically, the signal from lipid is suppressed in an MR spectroscopic imaging study. Lipid suppression employing the signal-space projection operator allows for an increased ability to resolve metabolite peaks. Furthermore, it provides better metabolite quantification in peripheral image voxels where quantification of metabolites without lipid suppression is not possible due to strong lipid contamination. MRS image voxels without serious lipid contamination are not affected by this technique. Spectral quality is improved as a result of successful removal of lipid signal in the baseline. Furthermore, signal-space projection suppresses lipid signal efficiently without intensive computation and can be used alone or in combination with lipid suppression imaging sequences to improve in vivo MRSI quality.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

GENERAL DESCRIPTION OF THE INVENTION

The principle of signal-space projection is that a desired signal can be separated from an external noise source given that the desired signal has a spatial distribution sufficiently different than the external noise. In general, data that is acquired with an MRI system can be described as having a signal component and a noise component in the form:

$$d(t)=d_s(t)+d_n(t), \quad (1)$$

Where d(t) is the MR data acquired with the MRI system, $d_s(t)$ is the signal component, and $d_n(t)$ is the noise component. When the noise present in the acquired data, $d_n(t)$, is well characterized by a few spatial patterns, $d_1 \ldots d_m$, the external noise source can be described as:

$$d_n(t)=Uc_n(t)+\epsilon(t), \quad (2)$$

Where U is a matrix whose columns form an orthonormal basis for the spatial patterns, $d_1 \ldots d_m$, $c_n(t)$ is an m-component column vector, and $\epsilon(t)$ is an error term. Signal-space projection provides a method for determining the small basis set, $d_1 \ldots d_m$, such that the condition presented in equation (2) is met. From equation (2), a signal-space projection operator, P, can be constructed to have the form:

$$P=I-U_m U_m^H, \quad (3)$$

Where $U_m$ is a noise subspace that contains the first m columns of U, I is an identity matrix, and $(\ldots)^H$ denotes the Hermitian transpose operator. In order to calculate the signal-space projection operator, P, a noise space is constructed and then decomposed such that the noise subspace, $U_m$, can be produced.

Consider a noise space, Y, that contains both spatial and temporal information corresponding to a measured signal, although alternatively the noise space may contain spatial and spectral information. By employing singular value decomposition (SVD) the noise space, Y, can be decomposed into its respective spatial and temporal (or spectral) patterns. This SVD is given by:

$$Y=USV^H, \quad (4)$$

Where columns of U and V are orthogonal spatial and temporal (or spectral) patterns, respectively, and S is a diagonal matrix whose elements are the corresponding singular values in decreasing order. The noise subspace is then selected on the basis of the power spectrum of the singular values in S. By applying the determined signal-space projection operator to measured MR data, the noise component, $d_n(t)$, is substantially suppressed. Therefore, noise-suppressed data is determined by calculating:

$$D'=PD, \quad (5)$$

Where D' is the noise-suppressed MR data and D is the data matrix whose columns include the MR measurements from all channels in a parallel receiver coil array and whose rows include the MR measurements from all time points or spectral frequencies.

DETAILED DESCRIPTION OF THE PREFERRED EMBODIMENT

Figure 1:
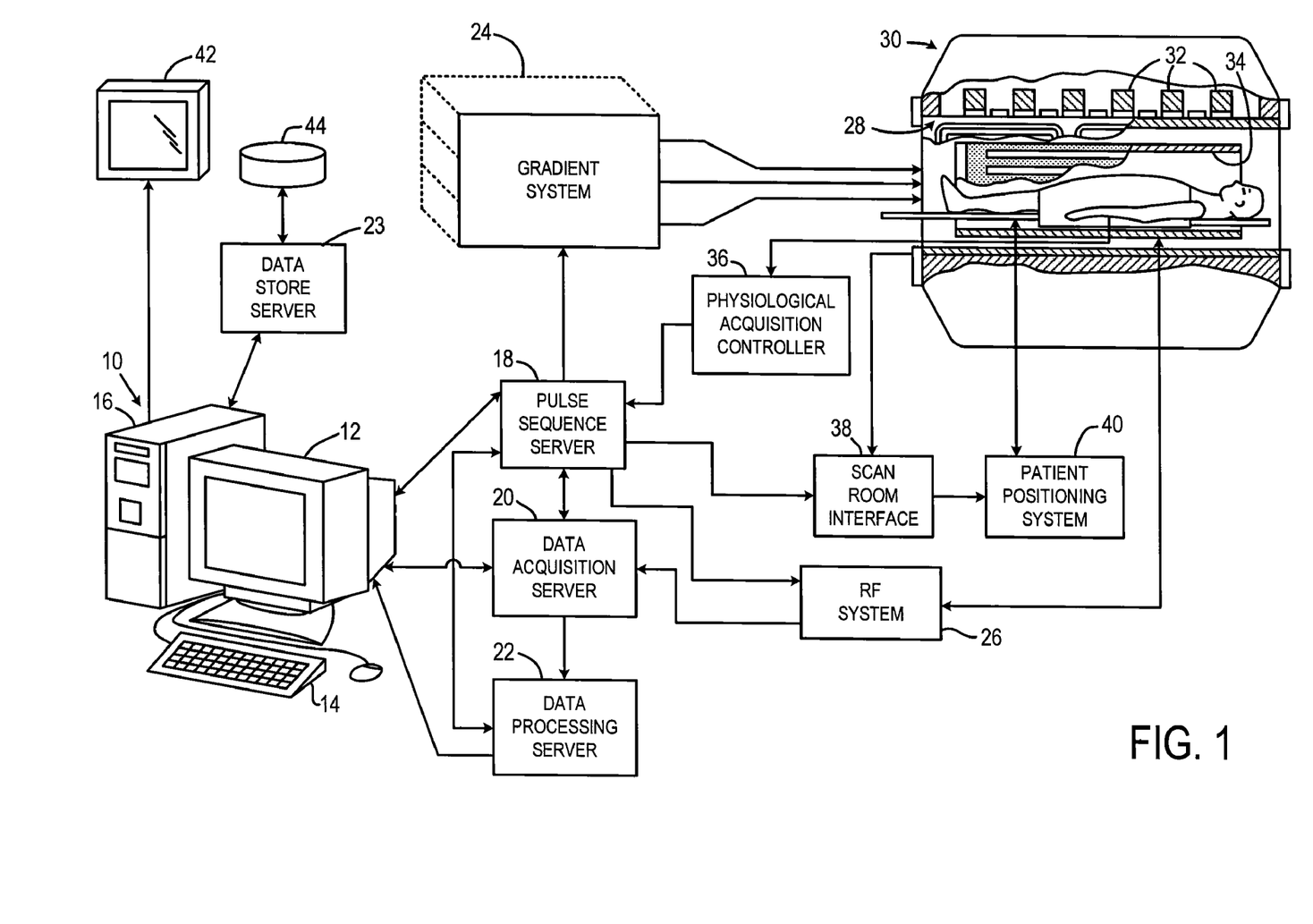
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers: a pulse sequence server 18; a data acquisition server 20; a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$ and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi = \tan^{-1}\left(\frac{Q}{I}\right).$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

In a first embodiment of the invention, the signal-space projection operator of the present invention is applied to an fMRI study. To achieve an order-of-magnitude speedup in the acquisition of time-resolved MR image data, spatial resolution is achieved using a multi-element RF coil array as an NMR signal detector rather than the usual time consuming image gradient encoding methods. The characteristics of the RF coil array that lend it to this application are as follows. A number of coil elements surround the object as completely as possible in a densely tiled arrangement. The spatial resolution of the invention is expected to increase as the number of spatially disparate detectors is increased. To provide spatially disparate information, the array elements should be uncoupled from one another. To provide both sensitivity and improved spatial information, the coils should be as close to the object as possible. If the array elements are for reception only, they should be detuned during the transmit phase of the MR experiment.

Figure 4:
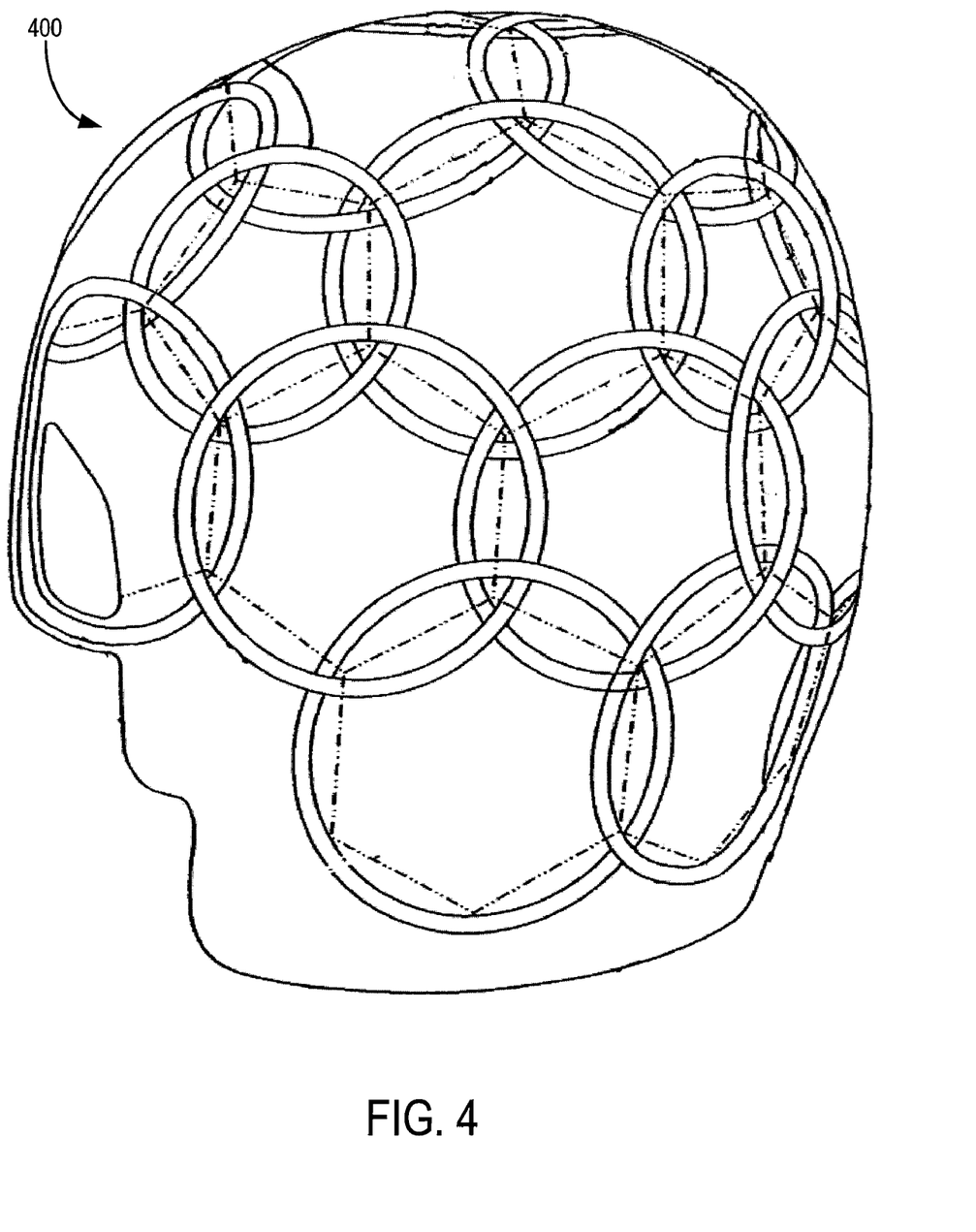
FIG. 4 is a pictorial representation of a 90-element coil used with the MRI system of FIG. 1 to practice a first preferred embodiment of the invention.

Referring particularly to FIG. 4, in the preferred embodiment of the invention a coil array 400 in the shape of a helmet is used to acquire images from the human brain. The close-fitting fiberglass helmet is modeled after the European head standard from EN960/1994 for protective headgear. This coil array 400 has 90 separate RF coil elements that are positioned over the curved helmet surface. Each coil element is substantially circular in shape and adjacent coil elements overlap such that their mutual inductance is minimized. As described in co-pending U.S. patent application Ser. No. 11/579,576 filed on Nov. 2, 2006 and entitled "MRI Polyhedral Coil Array Positioning With Non-Zero Gaussian Curvature", inductive coupling between coil elements is reduced by overlapping adjacent coil elements and using preamplifier decoupling. The cable leading from each of the 90 coil elements to the preamplifier in its corresponding receiver channel is carefully chosen and the tuning of the matching circuit to the preamplifier is chosen to transform the high preamplifier input impedance to a low impedance across the circular coil element. An arrangement of hexagonal and pentagonal tiles cover the helmet surface, similar to a geodesic tiling of a sphere. Each tile has sides that are approximately 23 mm long although it was necessary to distort the pentagonal tiles is places in order to map them onto the surface of the helmet. A circular surface coil is centered on each one of the tiles. Each surface coil is made from 0.031 inch thick G10 copper clad circuit board with a conductor width of 2.5 mm. The diameter of each coil element ranges from 4.5 cm to 5.5 cm. It has been found that significant 5 to 8-fold gains in SNR are possible with this structure as compared to conventional head coils, particularly in the cerebral cortex.

In the first preferred embodiment a series of time-resolved MR image data sets are acquired of the subject's brain while the subject is performing a prescribed function, or while the subject is stimulated in a prescribed manner. MR data for a complete image is acquired each 20 msecs during the dynamic study so that a high temporal resolution of the resulting brain activity is detected. Because the echo time (TE) needed to obtain maximum BOLD NMR signal response is much longer than 20 msecs (e.g., 43 msecs at 1.5T) a PRESTO echo-shifting pulse sequence, such as the one disclosed, for example, in Liu G, et al., "A functional MRI technique combining principles of echo-shifting with a train of observations (PRESTO)", Magn. Reson. Med. 1993; 30(6):764-8, is used.

Figure 5:
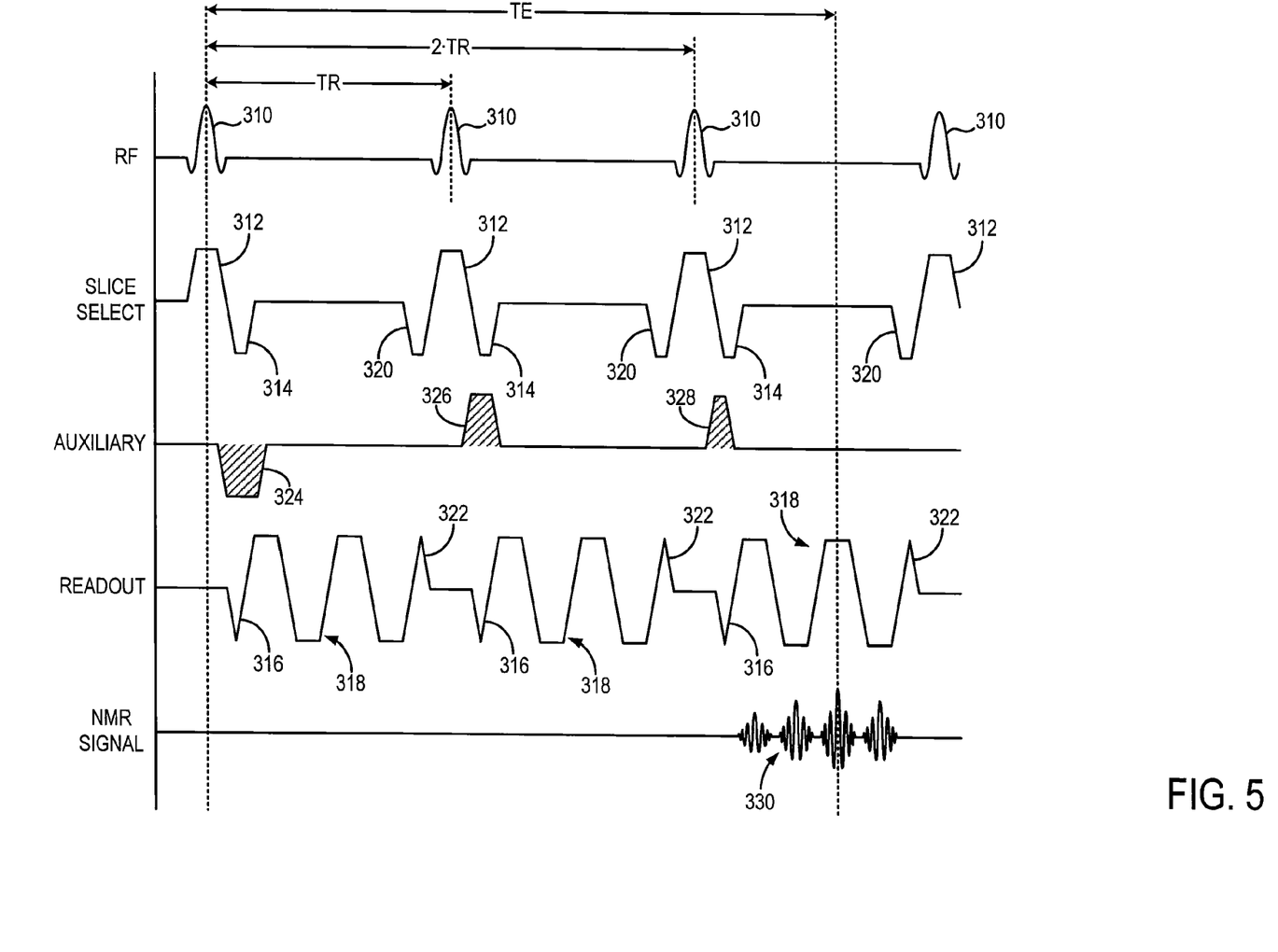
FIG. 5 is a graphic representation of a pulse sequence used to direct the MRI system of FIG. 1 when practicing a first preferred embodiment.

Referring particularly to FIG. 5, the pulse sequence begins by producing transverse magnetization in a slice through the subject by applying a 20 degree RF excitation pulse 310 in the presence of a slice selective gradient 312. The slice selective gradient 312 is followed by a rephasing gradient 314. While the rephasing gradient 314 is played out, a negative readout gradient lobe 316 is produced in the readout direction. The negative readout gradient lobe 316 is subsequently followed by a series of alternating readout gradients 318. After the readout gradients 318 have played out, a second rephasing lobe 320 is produced in the slice select direction and a positive readout gradient lobe 322 is produced in the readout direction. The purpose of the first and second rephasing gradients, 314 and 320, and the negative and positive readout gradient lobes, 316 and 322, are such that the net gradient waveform area for each gradient axis (e.g., slice select and readout) is zero during each repetition time (TR) interval. As a result of these zeroed gradient waveforms, auxiliary gradients can be employed during each TR interval to actively dephase the transverse magnetization such that a shifted echo time (TE) is achieved. The auxiliary gradients can be played out along any gradient axis and can alternatively be played out as a combination of gradient waveforms on more than one specific gradient axis.

In the first preferred embodiment of the present invention, the PRESTO pulse sequence includes a first auxiliary gradient pulse 324 and a second auxiliary gradient pulse 326 which are set to shift the echo time (TE) two TR periods, where a third auxiliary gradient 328 produces an echo train 330. This is achieved by setting the gradient area of the first auxiliary gradient 324 to −3·A to spoil the transverse magnetization produced by the RF excitation pulse 310. The second auxiliary gradient 326 has an area of 2·A and thus partially rephases the transverse magnetization. After the application of the third auxiliary gradient 328, which has a gradient area of A, the transverse magnetization rephases at the now shifted echo time, TE. Data acquisition is only performed during the application of the alternating readout gradients 318 that are played out in the presence of an echo train and the NMR signals corresponding to the echo train 330 are acquired separately by each of the 90 coil elements and each is slightly different due to the different location of each coil element. The result of such a pulse sequence is to increase $T_2^*$-weighting of the acquired image data, making it desirable for functional MRI (fMRI) data acquisitions. There is no phase encoding gradient in this pulse sequence, and therefore a scan for one image frame includes an application of the pulse sequence in which a straight line through the center of k-space is sampled. This is referred to herein as a 1D InI scan in which one gradient encoding axis is eliminated.

Figure 6:
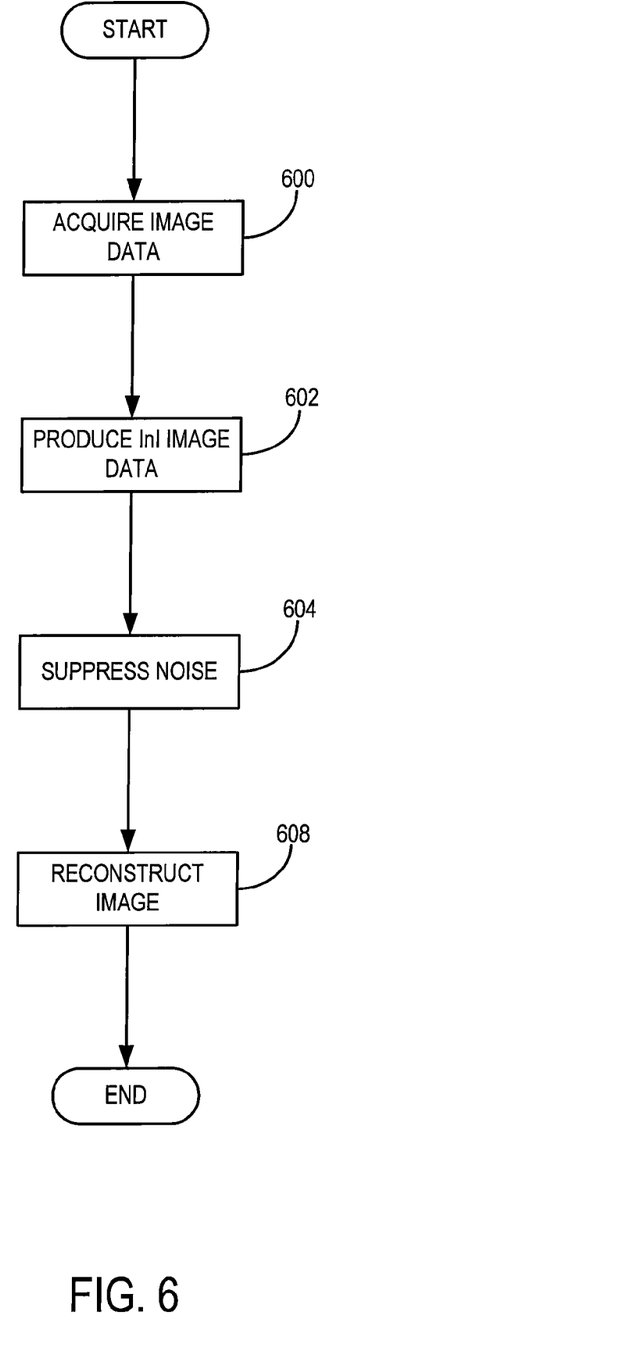
FIG. 6 is a flowchart which illustrates the steps used in a first preferred embodiment of the invention.

Referring particularly to FIG. 6, the first step in a preferred fMRI implementation of the present invention is to acquire a series of image frames in a 1D InI scan as indicated at process block 600, which is accomplished using the above-described pulse sequence. The resulting 1D array of complex k-space samples from each of the 90 receivers and each of the acquired image frames is stored. Prior to performing the noise suppression method of the present invention and subsequently reconstructing image frames, the k-space data must be prepared as indicated at process block 602. The nature of this preparation depends to some extent on the particular scan being performed, but in the fMRI scan of the preferred embodiment, the preparation steps are described in co-pending U.S. patent application Ser. No. 11/484,091, filed on Jul. 11, 2006 and entitled "Dynamic Magnetic Resonance Inverse Imaging". In general, the data preparation process includes preprocessing steps common to conventional fMRI techniques. Furthermore, the 1D array of k-space data for each channel in each image frame is Fourier transformed. This is a standard complex FFT which preserves the phase information in the I and Q components of the resulting signal samples. Each resulting signal sample is spatially resolved along the slice select axis and the readout gradient axis.

Figure 7:
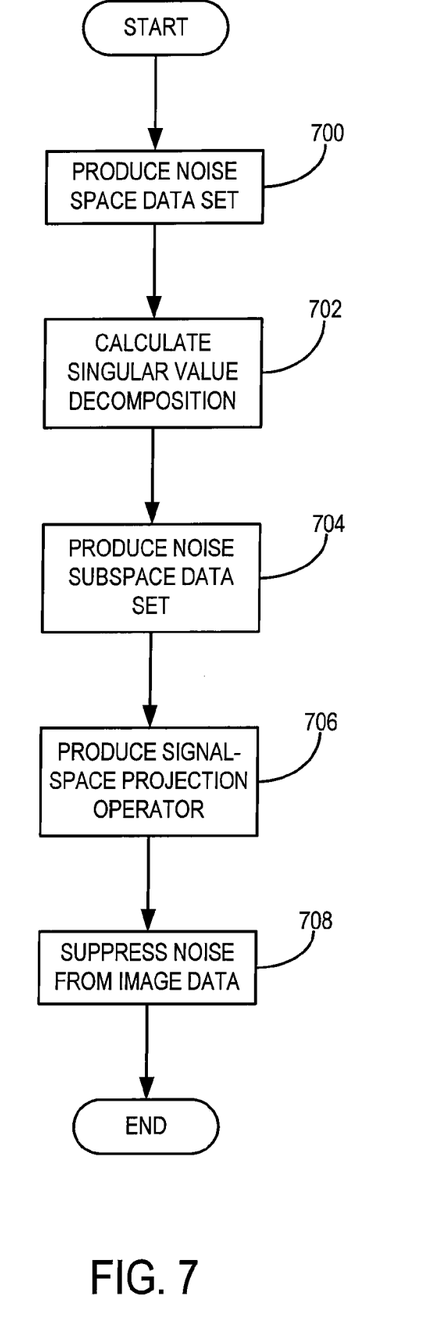
FIG. 7 is a flowchart of the steps used to practice the noise suppression method of the present invention.

Suppression of noise present in the prepared InI image data is performed, as indicated at process block 604. The steps corresponding to the noise suppression method are illustrated in FIG. 7, to which reference is now made. The noise suppression method of the present invention begins at process block 700 by producing a noise space data set, Y, from the acquired image data. For the first embodiment of the invention, the noise space data set, Y, is selected to be the pre-stimulus baseline data acquired during the fMRI scan. Here, the rows of Y represent the time series from different channels in the parallel RF receiver and the columns of Y represent the spatial pattern of the pre-stimulus image data acquired at the different time points in the time series. The singular value decomposition of the noise space data set, Y, is calculated next in process block 702. This is performed according to equation (4) and yields the unitary matrices U and V, and the diagonal matrix of singular values, S. At process block 704, a noise subspace data set, $U_m$, is produced from the unitary matrix U on the basis of the power spectrum of the singular values in S. Therefore, the noise subspace data set, $U_m$, contains the first m columns of the unitary matrix U. From the noise subspace data set, the signal-space projection operator, P, is subsequently calculated, as indicated at process block 706. The calculation of the signal-space projection operator, P, is performed in accordance with equation (3) above. A noise suppressed data set, D', can then be produced in step 708 by applying the signal-space projection operator to the prepared image data, D, as described in equation (5) above.

Referring again to FIG. 6, the image reconstruction thus proceeds by reconstructing images from the noise suppressed image data, D', as indicated at process block 606. In the preferred embodiment, the image reconstruction method employs a linear constrained minimum variance (LCMV) beamformer, such as that described in co-pending U.S. patent application Ser. No. 12/114,326, filed on May 02, 2008, and entitled "Dynamic Magnetic Resonance Inverse Imaging Using Linear Constrained Minimum Variance Beamformer". In the alternative, the image reconstruction can employ the method described in co-pending U.S. patent application Ser. No. 11/484,091, filed on Jul. 11, 2006 and entitled "Dynamic Magnetic Resonance Inverse Imaging".

In a second preferred embodiment of the invention, the MRI system is employed to acquire and reconstruct MR spectroscopy (MRS) images. The pulse sequence used to acquire the MRS image data is a Proton Echo Planar Spectroscopy Imaging (PEPSI) pulse sequence described in Posse, S., et al., Magn. Reson. Med., 1995, 33:34-40.

Figure 8:
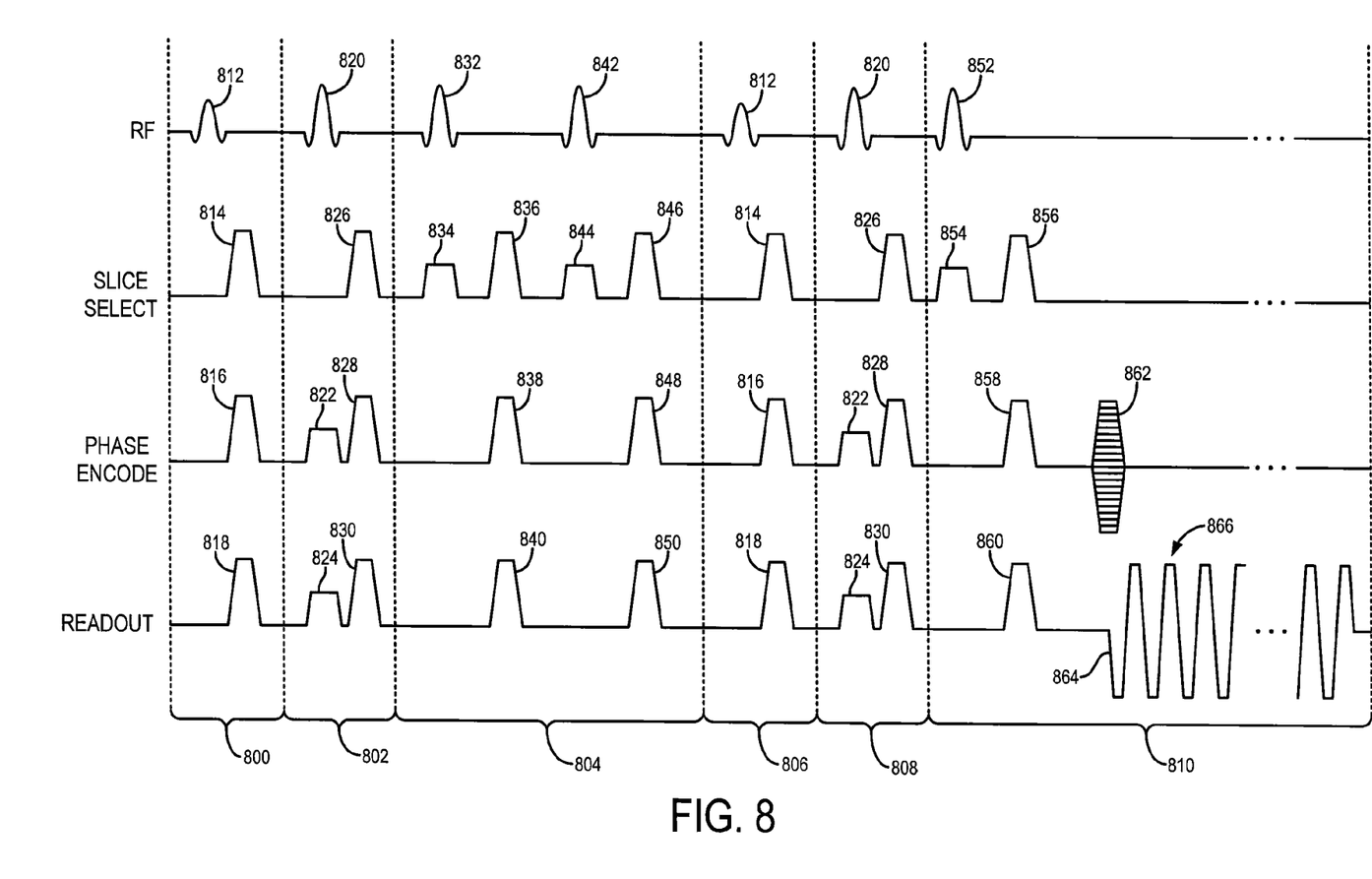
FIG. 8 is a graphic representation of a pulse sequence used to direct the MRI system of FIG. 1 when practicing a second preferred embodiment of the invention.

Referring particularly to FIG. 8, the PEPSI pulse sequence includes a first water suppression section 800, a first outer volume suppression section 802, a stimulated echo preparation section 804, a second water suppression section 806, a second outer volume suppression section 808, and a stimulated echo acquisition section 810. The first water suppression section 800 begins with a spectrally selective RF excitation pulse 812 that selectively excites all of the water spins contained within the field-of-view of the MRI system. The transverse magnetization produced by the water spins is then spoiled by the application of a spoiler gradient along the slice select direction 814, a spoiler gradient along the phase encode direction 816, and a spoiler gradient along the readout direction 818. In the preferred embodiment, the first water suppression section 800 is only executed once; however, in the alternative it may be repeated three times prior to proceeding with the remainder of the pulse sequence.

The PEPSI pulse sequence then proceeds by repeatedly performing a first outer volume section 802 eight times. During each execution of the first outer volume suppression section 802, an RF excitation pulse 820 is played out in the presence of a volume selective gradient applied along the phase encode direction 822 and a volume selective gradient applied along the readout direction 824. This results in the excitation of the spins in a column along the slice select direction that is defined by the volume selective gradients 822, 824. The transverse magnetization of these excited spins is subsequently spoiled by the application of a spoiler gradient along the slice select direction 826, the phase encode direction 828, and the readout direction 830. During each repetition of the first outer volume suppression section 802, the amplitudes of the volume selective gradients 822, 824, are changed in order to select a different volume.

A stimulated echo preparation section 804 is executed next. First, a 90 degree RF excitation pulse is played out in the presence of a slice selective gradient 834. Unwanted transverse magnetization outside of the selected slice is then by the application of a spoiler gradient along the slice select direction 836, the phase encode direction 838, and the readout direction 840. A second 90 degree RF excitation pulse 842 is then played out, again in the presence of a slice selective gradient 834. As before, unwanted transverse magnetization outside of the selected slice is then suppressed by the application of a spoiler gradient along the slice select direction 846, the phase encode direction 848, and the readout direction 850. A second water suppression section 806 is executed next and is similar to the first water suppression section 800. Like the first water suppression section 800, the second water suppression section 806 is executed once in the preferred embodiment, though in the alternative, it may be executed three times. Furthermore, a second outer volume suppression section 808 is repeatedly executed eight times in similar fashion to the first outer volume suppression section 802.

Lastly, a stimulated echo acquisition section 810 completes the PEPSI pulse sequence. The stimulated echo acquisition section 810 begins with the application of a 90 degree RF excitation pulse 852 in the presence of a slice selective gradient 854. The application of this 90 degree RF pulse will provide a stimulated echo, from which NMR signals are acquired. To suppress unwanted transverse magnetization, a spoiler gradient is played out along the slice select direction 856, the phase encode direction 858, and the readout direction 860. Next, a phase encoding gradient 862 is applied in the presence of a negative readout gradient lobe 864. As is well known in the art, the phase encoding gradient 862 is varied in amplitude during each repetition of the pulse sequence in order to spatial encode the acquired NMR signals. Finally, an alternating readout gradient 866 is played out along the readout direction to acquire NMR signals from the stimulated echo produced by the pulse sequence.

Figure 9:
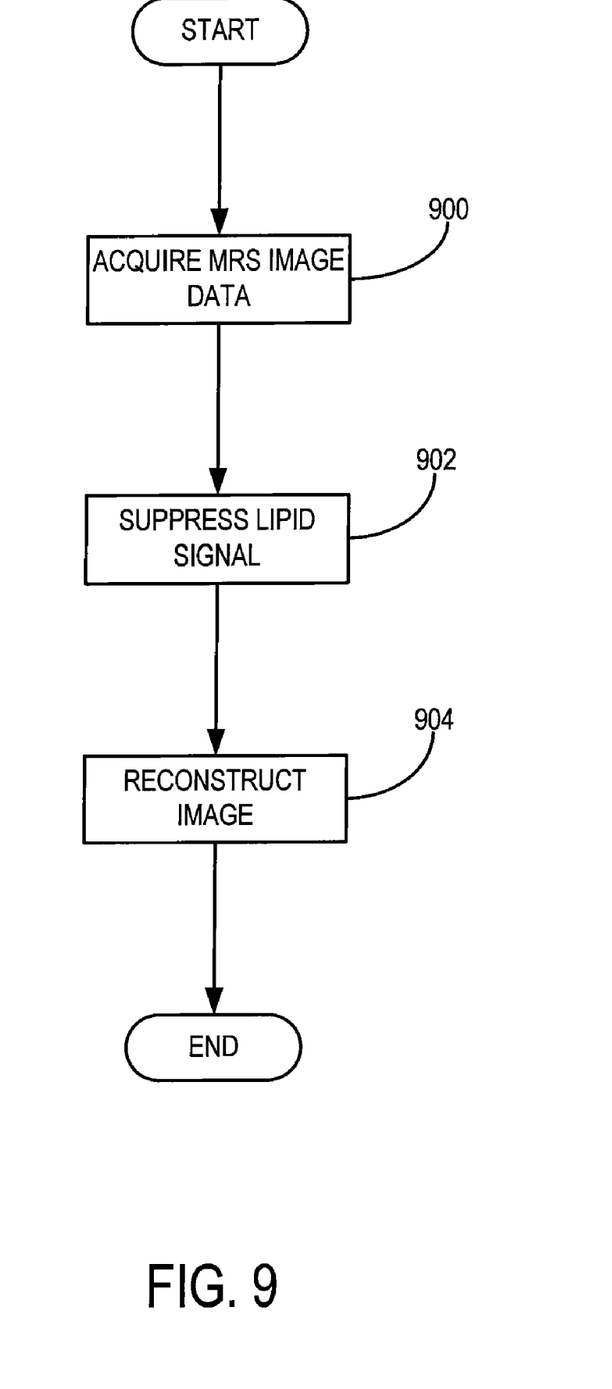
FIG. 9 is a flowchart which illustrates the steps used in a second preferred embodiment of the invention.

Referring particularly to FIG. 9, the first step in a preferred MRS implementation of the present invention is to acquire MRS image data as indicated at process block 900, which is accomplished using the above-described pulse sequence. The resulting 2D spatial-spectral array of complex k-space samples from each image slice is stored. The $(N_x \times N_y)$ columns of the MRS image data, D, correspond to the spatial size of the acquired data and the $N_f$ rows correspond to the spectral range of the acquired MRS image data.

Suppression of lipid signal present in MRS data is performed, as indicated at process block 902. The steps corresponding to the lipid suppression method proceed in the same manner as described above for noise suppression in fMRI, and are illustrated in FIG. 7, to which reference is now made. The lipid suppression method of the present invention begins at process block 700 by producing a noise space data set, Y, from the acquired MRS image data. For this embodiment of the invention, the noise space data set, Y, is extracted from the acquire MRS image data by selecting the data corresponding to the spectral range between 1.0 ppm and 1.5 ppm. Here, the rows of Y represent the spectral range and the columns of Y represent the spatial pattern of the MRS image data corresponding to the selected spectral range. The singular value decomposition of the noise space data set, Y, is calculated next in process block 702. This is performed according to equation (4) and yields the unitary matrices U and V, and the diagonal matrix of singular values, S. Here, the unitary matrix U represents the spatial components of the lipid signal and the unitary matrix V represents the spectral components of the lipid signal. At process block 704, a noise subspace data set, $U_m$, is produced from the unitary matrix U by selecting only the first m-components of the unitary matrix, U. Substantially all of the lipid signal can be suppressed from the acquired MRS data by employing the produced noise subspace, $U_m$. From the noise subspace data set, the signal-space projection operator, P, is subsequently calculated, as indicated at process block 706. The calculation of the signal-space projection operator, P, is performed in accordance with equation (3) above. A lipid suppressed data set, D', can then be produced in step 708 by applying the signal-space projection operator to the acquired MRS image data, D, as indicated in equation (5) above.

Referring again to FIG. 9, the image reconstruction thus proceeds by reconstructing images from the lipid suppressed image data, D', as indicated at process block 904. Even- and odd-echo data m reconstructed separately using a non-water suppressed reference scan for automatic phase and frequency shift correction. Metabolites of N-acetyl-aspartate (NM), Creatine (Cre) and Choline (Cho) can subsequently be quantified using the LCModel described in Provencher, S. W., et al., Magn. Reson. Med., 1993, 30(6):672-79. The quality of spectra is further evaluated by Cramer-Rao Lower Bound (CRLB), which is the lowest bound of the standard deviation of estimated metabolite concentration expressed in percentage.

The present invention has been described in terms of one or more preferred embodiments, and it should be appreciated that many equivalents, alternatives, variations, and modifications, aside from those expressly stated, are possible and within the scope of the invention. For example, as will be appreciated by those skilled in the art, the lipid suppression method of the present invention may be expanded to suppress the MR spectroscopic signal from any chemical species by selecting an appropriate spectral range to produce the noise space data set.

The invention claimed is:

1. A method for producing an image of a subject with a magnetic resonance imaging (MRI) system, the steps comprising:
   a) performing a pulse sequence with the MRI system to produce transverse magnetization in the subject that emits NMR signals;
   b) receiving the NMR signals with the MRI system;
   c) producing, from the received NMR signals, a signal-space projection operator that projects an NMR signal into a basis defined by spatial patterns of noise in said received NMR signals;
   d) correcting the received NMR signals with the signal-space projection operator produced in step c); and
   e) reconstructing, from the NMR signals corrected in step d), an image having suppressed noise.

2. The method as recited in claim 1 in which step c) includes:
   c)i) producing a noise space data set from the received NMR signals, the noise space data set containing information about the spatial and at least one of temporal and spectral patterns of noise in the received NMR signals; and
   c)ii) producing the signal-space projection operator from the noise space data set.

3. The method as recited in claim 1 in which step c) includes:
   c)i) producing a noise subspace data set from the received NMR signal, the noise subspace data set containing information about the spatial patterns of noise in the received NMR signals; and
   c)ii) producing the signal-space projection operator from the noise subspace data set.

4. The method as recited in claim 3 in which the signal-space projection operator is produced by subtracting a matrix product between the noise subspace data set and its Hermitian transpose from an identity matrix.

5. The method as recited in claim 3 in which step a) is performed during a functional MRI (fMRI) study.

6. The method as recited in claim 5 in which:
   the fMRI study includes a pre-stimulus baseline portion;
   the NMR signals received in step b) define a time series of image data; and
   the noise subspace data set produced in step c)i) includes NMR signals received during the pre-stimulus baseline portion of the fMRI study.

7. The method as recited in claim 3 in which:
   step a) is performed during an MR spectroscopic (MRS) imaging study;

the NMR signals received in step b) define a spatial-spectral image data set; and the noise subspace data set produced in step c)i) includes received NMR signals that correspond to a desired spectral range.

8. The method as recited in claim 7 in which the desired spectral range is about 1.0 part per million (ppm) to about 1.5 ppm.

9. The method as recited in claim 1 in which step b) includes receiving the NMR signals simultaneously with multiple coils and associated receive channels.

10. The method as recited in claim 1 in which step a) is performed during an fMRI study and step d) is performed to suppress physiological noise.

11. The method as recited in claim 1 in which the reconstructed image is an MR spectroscopic image and step d) is performed to suppress NMR signals from lipid.

12. The method as recited in claim 1 in which the signal-space projection operator is produced in step c) by:

c)i) producing a noise space data set from the received NMR signals, the noise space data set containing information about the spatial and at least one of temporal and spectral patterns of noise in the received NMR signals; and c)ii) producing a noise subspace data set from the noise space data set.

13. The method as recited in claim 12 in which step c)ii) includes calculating the singular value decomposition of the noise space data set.

14. The method as recited in claim 12 in which the signal-space projection operator is produced by subtracting a matrix product between the noise subspace data set and its Hermitian transpose from an identity matrix.

15. A method for suppressing noise in a series of time-resolved image data sets acquired with a magnetic resonance imaging (MRI) system, the steps comprising:

a) acquiring a series of time-resolved image data sets from a subject with the MRI system;

b) producing, from the series of time-resolved image data sets acquired in step a), a noise space data set that contains spatial and temporal information about the series of time-resolved image data sets;

c) producing, from the noise space data set produced in step b), a noise subspace data set indicative of spatial patterns corresponding to noise;

d) calculating, from the noise subspace data set produced in step c), a signal-space projection operator; and e) suppressing the noise in the acquired series of time-resolved image data sets by applying the calculated signal-space projection operator to the series of time-resolved image data sets.

16. The method as recited in claim 15 in which step d) includes subtracting a matrix product between the noise subspace data set and its Hermitian transpose from an identity matrix.

17. The method as recited in claim 15 in which:

step a) is performed during an fMRI study that includes a pre-stimulus baseline portion; and the noise space data set produced in step b) includes those image data sets acquired during the pre-stimulus baseline portion of the fMRI study.

18. A method for suppressing signal from a selected spin species in image data acquired with a magnetic resonance imaging (MRI) system, the steps comprising:

a) acquiring image data from a subject with the MRI system;

b) producing, from the image data acquired in step a), a noise space data set that contains spatial and spectral information about the image data;

c) producing, from the noise space data set produced in step b), a noise subspace data set indicative of spatial patterns corresponding to the selected spin species;

d) calculating, from the noise subspace data set produced in step c), a signal-space projection operator; and e) suppressing the signal from the selected species in the acquired image data by applying the calculated signal-space projection operator to the image data.

19. The method as recited in claim 18 in which step d) includes subtracting a matrix product between the noise subspace data set and its Hermitian transpose from an identity matrix.

20. The method as recited in claim 18 in which:

step a) is performed during an MR spectroscopic (MRS) imaging study; and the noise space data set produced in step b) includes substantially only NMR signals that correspond to a desired spectral range.

\* \* \* \* \*

UNITED STATES PATENT AND TRADEMARK OFFICE
CERTIFICATE OF CORRECTION

PATENT NO. : 7,683,620 B2  Page 1 of 1
APPLICATION NO. : 12/114339
DATED : March 23, 2010
INVENTOR(S) : Fa-Hsuan Lin It is certified that error appears in the above-identified patent and that said Letters Patent is hereby corrected as shown below:

Column 4, line 68, "(Gin)" should be --(Gln)--.

Column 8, line 35, " $M = \sqrt{I^2 + Q^2}$ " should be -- $M = \sqrt{I^2 + Q^2}$ --.

Column 12, line 53, "they by" should be --then suppressed by--.

Column 12, line 13, "(NM)" should be --(NAA)--.

Column 14, claim 3, line 46, "signal" should be --signals--.

Signed and Sealed this

Twentieth Day of April, 2010

David J. Kappos
*Director of the United States Patent and Trademark Office*